(12) United States Patent
Sato et al.

(10) Patent No.: US 12,004,429 B2
(45) Date of Patent: Jun. 4, 2024

(54) PIEZOELECTRIC BODY FILM, PIEZOELECTRIC BODY FILM PRODUCTION METHOD, AND PIEZOELECTRIC BODY DEVICE

(71) Applicant: Kureha Corporation, Tokyo (JP)

(72) Inventors: Yusuke Sato, Tokyo (JP); Hisaaki Terashima, Tokyo (JP); Nobufumi Sato, Tokyo (JP); Kazuyuki Kanno, Tokyo (JP); Keiko Aita, Tokyo (JP)

(73) Assignee: KUREHA CORPORATION, Tokyo (JP)

( * ) Notice: Subject to any disclaimer, the term of this patent is extended or adjusted under 35 U.S.C. 154(b) by 0 days.

(21) Appl. No.: 18/464,745

(22) Filed: Sep. 11, 2023

(65) Prior Publication Data

US 2023/0422627 A1    Dec. 28, 2023

Related U.S. Application Data

(62) Division of application No. 16/969,605, filed as application No. PCT/JP2018/039056 on Oct. 19, 2018.

(30) Foreign Application Priority Data

Mar. 5, 2018 (JP) ................. 2018-038532

(51) Int. Cl.
| | | |
|---|---|---|
| H10N 30/098 | (2023.01) | |
| B29C 71/02 | (2006.01) | |
| C08J 5/18 | (2006.01) | |
| H10N 30/857 | (2023.01) | |

(52) U.S. Cl.
CPC .............. *H10N 30/857* (2023.02); *C08J 5/18* (2013.01); *C08J 7/08* (2013.01); *H10N 30/098* (2023.02); *C08J 2327/16* (2013.01)

(58) Field of Classification Search
CPC ........ H10N 30/098; H10N 30/857; C08J 5/18
See application file for complete search history.

(56) References Cited

U.S. PATENT DOCUMENTS

| | | | |
|---|---|---|---|
| 4,308,370 A | 12/1981 | Fukuda et al. | |
| 4,668,449 A | 5/1987 | Soni et al. | |
| 5,016,333 A | 5/1991 | Payne et al. | |
| 5,254,296 A | 10/1993 | Perlman | |
| 2010/0068460 A1 | 3/2010 | Moriyama et al. | |
| 2012/0004555 A1 | 1/2012 | Ohnuma et al. | |
| 2013/0122275 A1 | 5/2013 | Moriyama et al. | |
| 2013/0240871 A1 | 9/2013 | Shimoda et al. | |
| 2014/0051825 A1 | 2/2014 | Yoshida et al. | |
| 2015/0015120 A1 | 1/2015 | Kaimori et al. | |
| 2015/0093841 A1 | 4/2015 | Shimoda et al. | |
| 2015/0322220 A1 | 11/2015 | Choi et al. | |
| 2015/0325228 A1 | 11/2015 | Choi et al. | |
| 2016/0016369 A1 | 1/2016 | Tarbutton et al. | |
| 2016/0380180 A1 | 12/2016 | Yoshida et al. | |

FOREIGN PATENT DOCUMENTS

| | | |
|---|---|---|
| CN | 201804553 U | 4/2011 |
| CN | 101578717 B | 5/2012 |
| CN | 103493235 A | 1/2014 |
| CN | 104094428 A | 10/2014 |
| EP | 0 118 757 A2 | 9/1984 |
| FR | 2 525 820 A1 | 10/1983 |
| JP | 61-84078 A | 4/1986 |
| JP | H1-91412 A | 4/1989 |
| JP | 2008/171935 A | 7/2008 |
| JP | 2011-6596 A | 1/2011 |
| JP | 2011/82931 A | 4/2011 |
| JP | 2011-192665 A | 9/2011 |
| JP | 2013-162051 A | 8/2013 |
| JP | 2014/56915 A | 3/2014 |
| JP | 2015-75968 A | 4/2015 |
| JP | 2015/111640 A | 6/2015 |
| JP | 2015/171100 A | 9/2015 |
| TW | I514585 A | 12/2015 |
| WO | WO 2015/064327 A1 | 5/2015 |

OTHER PUBLICATIONS

U.S. Office Action for U.S. Appl. No. 16/969,605, dated Oct. 20, 2023.
English translation of International Search Report of the International Searching Authority for PCT/JP2018/039056 with mailing date of Jan. 8, 2019.
Extended European Search Report issued Apr. 16, 2021, in European Patent Application No. 18908347.0.
Hiroji, "Piezoelectric and Pyroelectric Polymer Materials," Kobunshi/High Polymers, vol. 34, Sep. 1985, pp. 732-735, with partial English translation (10 pages total).

(Continued)

*Primary Examiner* — Caixia Lu

(74) *Attorney, Agent, or Firm* — Birch, Stewart, Kolasch & Birch, LLP

(57) ABSTRACT

To provide a piezoelectric body film that can suppress decrease in the piezoelectric constant d31, a method of producing a piezoelectric body film, and a piezoelectric body device. A piezoelectric body film comprising a fluororesin as a piezoelectric material, the fluororesin containing, as a main constituent unit, a repeating unit derived from vinylidene fluoride, a piezoelectric constant d31 of the piezoelectric body film being 20 pC/N or greater, and an extrapolated onset temperature at start of shrinkage determined by TMA measurement being not lower than 90° C. and not higher than 115° C. The difference between piezoelectric constants d31 measured before and after heating the piezoelectric body film at 100° C. for 24 hours relative to the piezoelectric constant d31 before the heating for 24 hours is 20% or less.

3 Claims, 1 Drawing Sheet

(56) References Cited

OTHER PUBLICATIONS

Inque et al., "Thermal stability of poly(vinylidene fluoride) films pre-annealed at various temperatures," Polymer Degradation and Stability (2007), vol. 92, pp. 1833-1840.

International Search Report of the International Searching Authority for PCT/JP2018/039056 with mailing date of Jan. 8, 2019.

Japanese Notice of Written Opposition for corrresponding Japanese Application No. 2018-038532, dated Sep. 9, 2022, with partial English translation.

Kaura et al., "Simultaneous stretching and corona poling of PVDF films," J. Phys. D: Appl. Phys., vol. 24, 1991, pp. 1848-1852.

Notification of Written Submission of Publications issued Dec. 15, 2020, in Japanese Patent Application No. 2018-038532.

Office Action issued Mar. 30, 2020, in Taiwan Patent Application No. 107141621.

Perlman et al., "Optimization of the Piezoelectric Properties of Uniaxially Stretched Polyvinylidene Flouride Films Corona Poled at Room and Elevated Temperatures," Conference on Electrical Insulation & Diaelectric Phenomena—Annual Report, 1983, pp. 447-453.

Sencadas et al., "Characterization of poled and non-poled b-PVDF films using thermal analysis techniques," Thermochimica Acta (2004), vol. 424, pp. 201-207.

Sencadas et al., "Thermal characterization of a vinylidene flouride-trifluorethylene (75-25) (%mol) copolymer film," Journal of Non-Crystalline Solids, vol. 352, 2006, pp. 5376-5381.

Written Opinion of the International Searching Authority issued Jan. 8, 2019, in PCT/JP2018/039056.

Chinese Office Action and Search Report for Chinese Application No. 201880089047.6. dated Dec. 15, 2022, with an English translation.

Extended European Search Report for European Application No. 18908347.0, dated Apr. 16, 2021.

Li et al., "Production and Application Prospect of Polyvinylidene Fluoride Resin," Organo—Fluorine Industry, 2009, pp. 12-18, with an English translation.

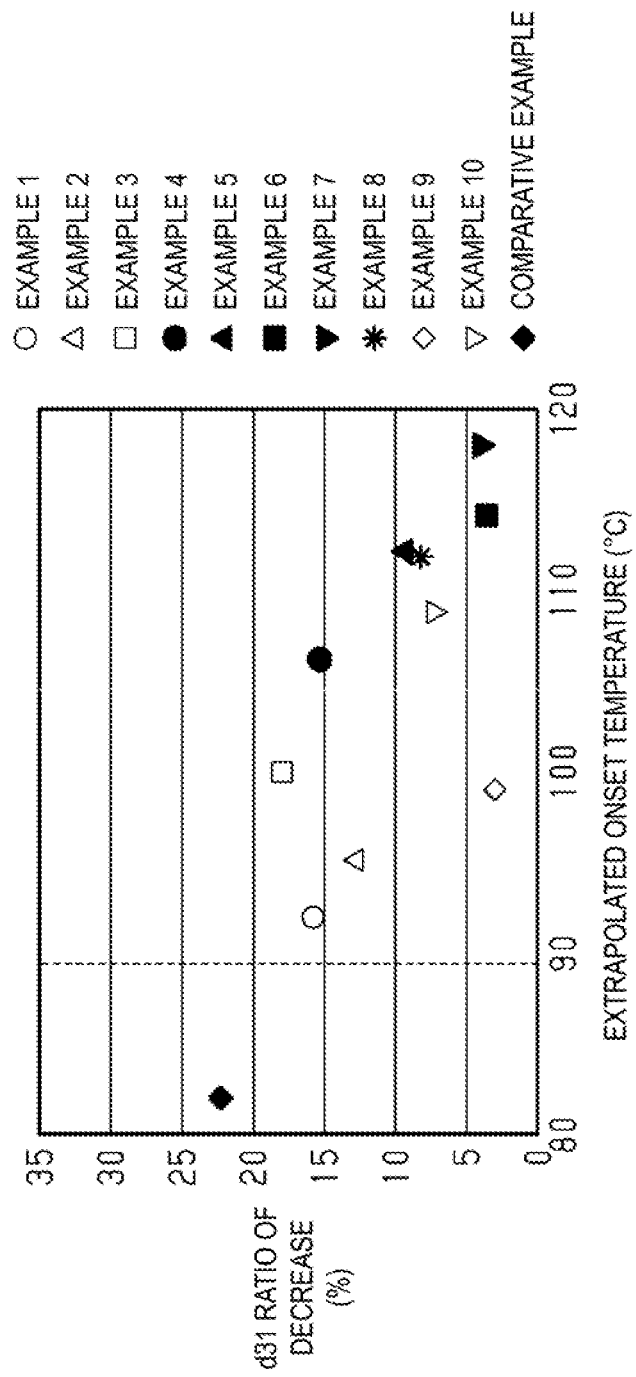

PIEZOELECTRIC BODY FILM, PIEZOELECTRIC BODY FILM PRODUCTION METHOD, AND PIEZOELECTRIC BODY DEVICE

This application is a Divisional of copending application Ser. No. 16/969,605, filed on Aug. 13, 2020, which is the National Phase under 35 U.S.C. § 371 of International Application No. PCT/JP2018/039056, filed on Oct. 19, 2018, and which in turn claims priority under 35 U.S.C. § 119(a) to Patent Application No. 2018-038532, filed in Japan on Mar. 5, 2018, all of which are hereby expressly incorporated by reference into the present application.

TECHNICAL FIELD

The present invention relates to a piezoelectric body film containing, as a piezoelectric material, a fluororesin having a repeating unit derived from vinylidene fluoride as a main constituent unit, a method of producing the piezoelectric body film, and a piezoelectric body device having the piezoelectric body film.

BACKGROUND ART

Piezoelectric body films having polyvinylidene fluoride as a piezoelectric material have been used in various uses, including various sensors, such as vibration sensors, contact sensors, ultrasonic sensors, and acceleration sensor, and various actuators, such as actuators for vibration and actuators for vibration damping. In Patent Document 1, uniaxial stretching treatment of a polyvinylidene fluoride sheet in the machine direction (MD) and polarization treatment of the polyvinylidene fluoride sheet are performed simultaneously in the production of a polyvinylidene fluoride film.

Piezoelectric body film produced by stretching in the MD is excellent from the perspective of having a high piezoelectric constant d31.

CITATION LIST

Patent Literature

Patent Document 1: JP 2008-171935 A

SUMMARY OF INVENTION

Technical Problem

The piezoelectric body film produced by stretching is typically temporarily stored as a product wound in a roll form, and then taken out from the roll-formed product when used for processing of a sensor or an actuator. During the processing of a sensor or an actuator, a piezoelectric body film is heated at high temperatures during a processing process that accompanies heating, such as vapor deposition treatment and lamination treatment. As a result, a new problem arises, in which a piezoelectric body film heated at high temperatures exhibits a reduction in the piezoelectric constant d31. Problems thus occur in a piezoelectric body device having such a piezoelectric film with the reduced piezoelectric constant d31.

An object of the present invention is to provide a piezoelectric body film that can suppress reduction in the piezoelectric constant d31, a method of producing a piezoelectric body film, and a piezoelectric body device.

Solution to Problem

The piezoelectric body film to solve the problem described above is a piezoelectric body film including a fluororesin as a piezoelectric material, the fluororesin containing, as a main constituent unit, a repeating unit derived from vinylidene fluoride, a piezoelectric constant d31 of the piezoelectric body film being pC/N or greater, and an extrapolated onset temperature at start of shrinkage determined by TMA measurement being not lower than 90° C. and not higher than 135° C.

The method of producing a piezoelectric body film to solve the problem described above comprises: a film formation step including subjecting a sheet to stretching treatment and polarization treatment, the sheet being formed from a fluororesin containing a repeating unit derived from vinylidene fluoride as a main constituent unit and thus forming a crystalline polymer film having piezoelectricity (hereinafter, also simply referred to as "crystalline polymer film"); a relaxation step including subjecting the crystalline polymer film to heating at a first temperature that is not lower than 90° C. and not higher than 115° C. for 5 seconds to 130 seconds, and thus performing heat fixation and relaxation of residual strain of the crystalline polymer film; and a secondary heating step including subjecting the crystalline polymer film after the relaxation step to reheating at a temperature that is not lower than the first temperature and not higher than 140° C., and thus producing the piezoelectric body film.

The method of producing a piezoelectric body film to solve the problem described above is a method of producing a piezoelectric body film from a crystalline polymer sheet, the method including: a film formation step including subjecting a sheet to stretching treatment and polarization treatment, the sheet being formed from a fluororesin containing a repeating unit derived from vinylidene fluoride as a main constituent unit, and thus forming a crystalline polymer film having piezoelectricity; and a relaxation step including subjecting the crystalline polymer film to heating at a temperature higher than 115° C. and not higher than 150° C. for 10 seconds to 140 seconds, and thus performing heat fixation and relaxation of residual strain of the crystalline polymer film.

According to the piezoelectric body film and the method of producing a piezoelectric body film, reduction of the piezoelectric constant d31 due to processing can be suppressed even when the piezoelectric body film is heated during the processing of the piezoelectric body film.

In the piezoelectric body film, the difference between piezoelectric constants d31 measured before and after test treatment may be 20% or less relative to the piezoelectric constant d31 before the test treatment. The test treatment is a treatment by which the piezoelectric body film is heated at 100° C. for 24 hours. With this piezoelectric body film, because the ratio of decrease in the piezoelectric constant d31 is ensured to be 20% or less, it also becomes possible to further ensure suppression of reduction in the piezoelectric constant d31 due to processing compared to a configuration in which a piezoelectric body film is specified by the piezoelectric constant d31 and the extrapolated onset temperature.

In the piezoelectric body film, the fluororesin may be a homopolymer of vinylidene fluoride. With this piezoelectric body film, it is easier to make the piezoelectric constant d31 of the piezoelectric body film higher compared to a configuration in which the fluororesin is a copolymer of vinylidene fluoride.

In the method of producing a piezoelectric body film, in the secondary heating step, heating of the crystalline polymer film may be performed at the first temperature. With this method of producing a piezoelectric body film, the relaxation step and the secondary heating step can share the same heating equipment.

The piezoelectric body device to solve the problem described above has the piezoelectric body film.

Advantageous Effects of Invention

With the piezoelectric body film, the method of producing a piezoelectric body film, and the piezoelectric body device according to embodiments of the present invention, suppression of reduction in the piezoelectric constant $d31$ is made possible.

BRIEF DESCRIPTION OF THE DRAWINGS

FIG. 1 is a graph showing a relationship between extrapolated onset temperatures and piezoelectric constants $d31$ in Examples and Comparative Example.

DESCRIPTION OF EMBODIMENTS

An embodiment of each of the piezoelectric body film, the method of producing a piezoelectric body film, and the piezoelectric body device is described below with reference to FIG. 1. Note that, for example, a piezoelectric body film is transported in a roll form as a product. The piezoelectric body device having the piezoelectric body film is produced using the piezoelectric body film taken out from the product of the piezoelectric body film.

Piezoelectric Body Film

The piezoelectric body film contains, as a piezoelectric material, a fluororesin having a repeating unit derived from vinylidene fluoride as a main constituent unit. The fluororesin is a resin containing a repeating unit derived from vinylidene fluoride as a main constituent unit (hereinafter, also referred to as "polyvinylidene fluoride resin"). In the present specification, "containing a repeating unit derived from vinylidene fluoride as a main constituent unit" means containing 50 mol % or greater of the repeating unit derived from vinylidene fluoride when all the repeating units constituting the resin is taken as 100 mol %.

The polyvinylidene fluoride resin is preferably a homopolymer but may be a copolymer. The copolymer herein is preferably a copolymer of vinylidene fluoride and at least one monomer selected from the group consisting of 1-chloro-1-fluoro-ethylene, 1-chloro-2-fluoro-ethylene, trifluoroethylene, chlorotrifluoroethylene, tetrafluoroethylene, tetrafluoropropene, hexafluoropropylene, and vinyl fluoride.

Note that an inherent viscosity of the polyvinylidene fluoride resin is preferably 1.0 dL/g or greater. The inherent viscosity of the resin is a measured value of a dimethylformamide solution having a concentration of 0.4 g/dL at 30° C. With the polyvinylidene fluoride resin having the inherent viscosity of 1.0 dL/g or greater, breakage of a sheet due to shear force acting on the sheet in necking drawing can be suppressed. A polyvinylidene fluoride resin having an inherent viscosity of not smaller than 1.1 dL/g and not greater than 2.0 dL/g can achieve high strength and excellent stretchability in necking drawing. Necking drawing is a form of stretching that forms a narrow part (necking part) in sheet thickness and width at a point in a direction along which the sheet moves during stretching treatment.

The piezoelectric body film may contain a resin besides fluororesin or a component such as an additive. Examples of the resin besides fluororesin include methacryl resins, cellulose derivative resins, polyester resins, and polycarbonate resins.

Furthermore, examples of the additive include metal oxide particles, coupling agents, and surfactants. Examples of the metal oxide particles include alumina particles, magnesium oxide particles, zirconium oxide particles, and yttrium oxide particles. The coupling agent has a function to enhance degree of bonding between the metal oxide particles dispersed in the fluororesin and the piezoelectric material, and examples of the coupling agent include organic titanium compounds, organic silane compounds, organic zirconium compounds, and organic aluminum compounds. The surfactant has a function to enhance affinity between the metal oxide particles dispersed in the fluororesin and the piezoelectric material, and examples of the surfactant include nonionic surfactants, anionic surfactants, and cationic surfactants.

The piezoelectric body film satisfies the following [Condition 1] and [Condition 2].

[Condition 1] The piezoelectric constant $d31$ is 20 pC/N or greater.

[Condition 2] The extrapolated onset temperature at the start of shrinkage is not lower than 90° C. and not higher than 135° C.

Note that the extrapolated onset temperature at the start of shrinkage is determined by thermomechanical analyzer (TMA) measurement using a piezoelectric body film. The extrapolated onset temperature is a temperature in accordance with HS K 0129. The extrapolated onset temperature is a temperature at the point of intersection of a straight line obtained by extending the base line of the lower temperature side to the higher temperature side and a tangent at the point of greatest slope of the curve in the lower temperature side of the peak, in the heating measurement. The extrapolated onset temperature is a temperature at which the piezoelectric body film exhibits thermal shrinkage phenomenon.

The piezoelectric body film preferably satisfies the following [Condition 3].

[Condition 3] The ratio of decrease in the piezoelectric constant $d31$ in test treatment is 20% or less.

Note that the test treatment is a test performed by heating the piezoelectric body film at 100° C. for 24 hours, and the ratio of decrease in the piezoelectric constant $d31$ is a ratio of the difference between piezoelectric constants $d31$ measured before and after the test treatment to the piezoelectric constant $d31$ before the test treatment.

Note that the piezoelectric body film may have a surface abrasion mark in a direction identical with the direction in which piezoelectric constant $d31$ is expressed. Such surface abrasion mark can be made by using an electrically conductive heating roll for stretching treatment in the production of the piezoelectric body film where the heating roll has a rough surface. The surface abrasion mark in the piezoelectric body film can enhance adhesive strength between the piezoelectric body film and an electrode. The thickness of the piezoelectric body film is, for example, not less than vim and not greater than 500 μm.

Piezoelectric Body Device

The piezoelectric body device may be various sensors, such as a pressure sensor, a vibration sensor, a contact sensor, an ultrasonic sensor, or an acceleration sensor, or various actuators, such as an actuator for vibration or an actuator for vibration damping.

The vibration sensor, which is an example of sensor devices, includes a weight that receives vibration and moves, and a piezoelectric body film that receives the load applied by the weight, and the piezoelectric body film includes electrodes on a top face and a back face thereof. Then, the vibration sensor detects the change in load applied by the weight that moves when the vibration sensor receives the vibration, as a voltage signal between the electrodes that sandwiches the piezoelectric body film.

A contact sensor, which is another example of sensor devices, includes a cover film and the piezoelectric body film that overlaps the cover film, and the piezoelectric body film includes electrodes on a top face and a back face thereof. Then, the contact sensor detects a voltage signal between the electrodes that sandwiches the piezoelectric body film, and detects a position where the change in the voltage signal was detected as a position that was pressed by the cover film.

First Production Method of Piezoelectric Body Film

The first production method of the piezoelectric body film uses a crystalline polymer sheet as a starting raw material. The crystalline polymer sheet is formed using fluororesin as a main component. The first production method of the piezoelectric body film includes (A) film formation step, (B) first relaxation step, and (C) a secondary heating step. Between the (B) first relaxation step and the (C) secondary heating step, the crystalline polymer film is wound in a roll form and, for example, allowed to stand still for several days at room temperature.

(A) Film Formation Step

The film formation step is a step of forming a crystalline polymer film from a crystalline polymer sheet by subjecting the crystalline polymer sheet to stretching treatment and polarization treatment. The stretching treatment and the polarization treatment may be performed simultaneously, or the polarization treatment may be performed after performing the stretching treatment.

The resin constituting the crystalline polymer sheet is a resin using the fluororesin described in the section of the piezoelectric body film above as a main component. Note that "main component" herein means a component that is included in a largest amount among components used to form the crystalline polymer sheet, in the crystalline polymer sheet. The resin constituting the crystalline polymer sheet exhibits piezoelectricity by the polarization treatment which is application of DC voltage.

The crystalline polymer sheet before being subjected to the stretching treatment and the polarization treatment is a sheet having no piezoelectricity and, for example, is formed by using a melt extrusion method or a solution casting method. In the crystalline polymer sheet formed by a melt extrusion method, the thickness of the crystalline polymer sheet is appropriately adjusted by changing stretching conditions. The thickness of the crystalline polymer sheet is, for example, preferably not less than 20 μm and not greater than 2500 μm, and more preferably not less than 40 μm and not greater than 1500 μm. The crystalline polymer sheet having a thickness of not less than 20 μm is less likely to cause breakage of the crystalline polymer sheet during the stretching treatment. The crystalline polymer sheet having a thickness not greater than 2500 μm tends to have flexibility appropriate for transporting the crystalline polymer sheet during the stretching treatment.

The crystalline polymer sheet is supplied to a heating roll having electrical conductivity. The crystalline polymer sheet supplied to the heating roll is subjected to necking drawing in a region where the crystalline polymer sheet makes contact with the heating roll while the stretching direction is the MD. To proceed the necking drawing efficiently, the temperature of the heating roll is set to not lower than room temperature and lower than the melting point of the crystalline polymer sheet, for example, not lower than 70° C. and not higher than 135° C. At this time, a DC voltage is applied between a non-contact electrode connected to a direct-current power source and a grounded heating roll, and thus the stretching treatment of the crystalline polymer sheet and the polarization treatment of the crystalline polymer sheet are simultaneously performed.

Note that the stretching ratio of the crystalline polymer sheet is, for example, not less than 2.5-times and not more than 6.0-times. When the stretching ratio of the crystalline polymer sheet is 2.5-times or greater, the necking drawing tends to be stable. When the stretching ratio of the crystalline polymer sheet is 6.0-times or less, suppression of breakage of the crystalline polymer sheet and the crystalline polymer film is facilitated.

(B) First Relaxation Step

The first relaxation step is a step of, by heating the crystalline polymer film formed in the film formation step, relaxing the residual strain in the crystalline polymer film and heat fixing the crystalline polymer film. The crystalline polymer film after the heat fixation is less likely to exhibit thermal shrinkage in a processing process in which treatment involving heating is performed, compared to the crystalline polymer film before the heat fixation. Examples of the method of heating the crystalline polymer film include a method of exposing the crystalline polymer film to hot air, a method of passing the crystalline polymer film through the heating roll, and combinations of these.

The temperature of the crystalline polymer film in the first relaxation step is a first temperature. The first temperature is a temperature not lower than 90° C. and not higher than 115° C. The heating time of the crystalline polymer film in the first relaxation step is, for example, not less than 1 minute and not more than 5 minutes.

(C) Secondary Heating Step

The secondary heating step is a step of forming a piezoelectric body film from the crystalline polymer film using the crystalline polymer film after the heat fixation, and includes heating the crystalline polymer film again (reheating) so as to enhance heat resistance of the crystalline polymer film. Examples of the method of reheating the crystalline polymer film include a method of exposing the crystalline polymer film to hot air, a method of passing the crystalline polymer film through the heating roll, and combinations of these.

The temperature of the crystalline polymer film in the secondary heating step is a second temperature. The second temperature is a temperature not lower than the first temperature and 140° C. or lower. Therefore, a range of not lower than 90° C. and not higher than 140° C. is the greatest range for the second temperature. The heating time of the crystalline polymer film in the secondary heating step is not less than 15 seconds and not more than 120 seconds, and preferably not less than 20 seconds and not more than 60 seconds. When the second temperature is 140° C. or lower, softening of the crystalline polymer film can be suppressed. Note that, in the secondary heating step, heating at the second temperature is preferably performed while a predetermined tension is applied to the crystalline polymer film. When the heating time is 15 seconds or less, desired characteristics cannot be achieved, and when the heating time is 120 seconds or greater, durability of the crystalline polymer film is limited.

Note that a piezoelectric body film as a product is typically wound in a roll form or taken out from the roll for following processing processes that use the piezoelectric body film. At this time, a crystalline polymer film is taken out for a processing process for a sensor or the like and heated for the processing process, such as surface vapor deposition treatment and dry lamination treatment. As a result, even with a crystalline polymer film after heat fixation, a little thermal shrinkage (after-shrinkage) of the crystalline polymer film occurs, and thus the piezoelectric constant $d31$ of the crystalline polymer film may decrease.

In this regard, in the method of producing the piezoelectric body film described above, the crystalline polymer film wound in a roll form is allowed to stand still, and then the secondary heating step is performed for the crystalline polymer film. The crystalline polymer film wound in a roll form is then taken out for the secondary heating step and reheated at not lower than the first temperature and 140° C. or lower. As a result, the shrinkage caused in the processing process described above of the piezoelectric body film is corrected in advance in this secondary heating step. Note that, for the crystalline polymer film after the heat fixation, the temperature at which the after-shrinkage occurs is already increased by the heat fixation. On the other hand, in the secondary heating step, the crystalline polymer film is reheated at a temperature that is not lower than the temperature at the time of this heat fixation. Therefore, it is also possible to correct the after-shrinkage even if the temperature at which the after-shrinkage occurs is increased by the heat fixation.

Second Production Method of Piezoelectric Body Film

Similar to the first production method, the second production method of the piezoelectric body film uses a crystalline polymer sheet as a starting raw material. The second production method of the piezoelectric body film includes (A) film formation step and (B) second relaxation step. Note that, because (A) film formation step is identical to the film formation step of the first production method, the explanation thereof is omitted herein. Herein, (B) second relaxation step is described in detail below.

(B) Second Relaxation Step

Although the second relaxation step in the second production method is treatment similar to the first relaxation step in terms of heating the crystalline polymer film, the temperature range for the crystalline polymer film is different. That is, the temperature of the crystalline polymer film in the second relaxation step is preferably a temperature that is higher than 115° C. and 150° C. or lower, and more preferably a temperature that is higher than 130° C. and 135° C. or lower. Note that the heating time for the crystalline polymer film in the second relaxation step is, for example, preferably not less than 10 seconds and not more than 140 seconds, and more preferably not less than 20 seconds and not more than 140 seconds.

The temperature in the second relaxation step is not particularly limited as long as the temperature is in the temperature range described above. Note that, when the temperature for heating the crystalline polymer film is 115° C. or lower, similar to the first production method, the secondary heating step is necessary. Furthermore, when the temperature for heating the crystalline polymer film is 150° C. or higher, durability of the crystalline polymer film is limited.

In this regard, in a case where the second production method includes performing the second relaxation step, (C) secondary heating step in the first production method can be omitted. That is, in the second production method, the extrapolated onset temperature can be set to not lower than 90° C. and not higher than 135° C. without performing (C) secondary heating step. Furthermore, the ratio of decrease in the piezoelectric constant $d31$ of the crystalline polymer film obtained by the second production method can be reduced.

Examples 1 to 8: First Production Method

Using a polyvinylidene fluoride (KF #1100, available from Kureha Corporation) sheet having a thickness of 100 μm as a crystalline polymer sheet, necking drawing treatment and subsequent polarization treatment were performed to the crystalline polymer sheet. At this time, the crystalline polymer sheet was passed through heating roll, which was heated to raise a surface temperature to 120° C., and the DC voltage was increased from 0 kV to 20 kV, and thus the polarization treatment was performed after the stretching treatment. For each Example, the crystalline polymer film having a thickness of 27 μm was thus obtained.

Next, the first temperature was set to 100° C. and the heating time was set to 10 seconds, and the first relaxation step by hot air was performed on the crystalline polymer film of each of Examples. In addition, the first temperature was set to 90° C. and the heating time was set to 2 minutes, and the crystalline polymer film which had been exposed to the hot air was passed through a heating roller to further perform the first relaxation step. Then, the crystalline polymer film after the first relaxation step by the hot air and the heating roller was wound in a roll form and allowed to stand still at room temperature for 3 days. Note that, in the first relaxation step by the hot air and the heating roller, various feeding speeds for the crystalline polymer film were employed within the first relaxation step to make the tension on the crystalline polymer film to be constant.

Next, the second temperature was set to not lower than 90° C. and not higher than 130° C. and the heating time was set to not less than 20 seconds and not more than seconds, and thus the secondary heating step was performed for the crystalline polymer film after the first relaxation step. Then, one of the second temperature or the heating time was modified to produce 8 different types of piezoelectric body films of Examples. Note that the second temperature of Example 1 was 90° C., and the heating time was 60 seconds. The second temperature of Example 2 was 100° C., and the heating time was 60 seconds. The second temperature of Example 3 was 110° C., and the heating time was 60 seconds. The second temperature of Example 4 was 120° C., and the heating time was 60 seconds. The second temperature of Example 5 was 125° C., and the heating time was 40 seconds. The second temperature of Example 6 was 125° C., and the heating time was 60 seconds. The second temperature of Example 7 was 130° C., and the heating time was 60 seconds. The second temperature of Example 8 was 130° C., and the heating time was 20 seconds. Furthermore, a piezoelectric body film of Comparative Example was produced using the same conditions as those of Examples except for performing no secondary heating step.

Examples 9 and 10: Second Production Method

Using the crystalline polymer film used in Examples 1 to 8 and having a thickness of 27 μm, the second relaxation step by hot air was performed on the crystalline polymer film by setting the heating temperature of the second relaxation step to 135° C. and the heating time to 20 seconds. In addition, the temperature was set to 90° C. and the heating time was set to 2 minutes, and the crystalline polymer film which had been exposed to the hot air was passed through a heating roller to further perform a temperature control step at a low temperature. Thereafter, a piezoelectric film of Example 9 was obtained in the same manner as in Examples 1 to 8 except for performing no secondary heating treatment. Furthermore, a piezoelectric film of Example 10 was obtained in the same manner as in Example 9 except for changing the heating roller temperature in Example 9 to 120° C. from 90° C. and made the temperature control step an extension of the second relaxation step. Note that, in Examples 9 and 10, the temperature control step after the second relaxation step suppresses rapid cooling of the crystalline polymer film after the second relaxation step, and suppresses formation of crimps caused by rapid cooling of a thin crystalline polymer film or suppresses formation of warping caused by rapid cooling of a thick crystalline polymer film.

Then, for each of the piezoelectric body films of Examples 1 to 10 and the piezoelectric body film of Comparative Example, based on the following conditions, the extrapolated onset temperature, the piezoelectric constant d31, and the ratio of decrease in the piezoelectric constant d31 were measured.

Test Piece

An aluminum electrode having a thickness of not less than 100 nm and not greater than 800 nm was formed by a vapor deposition method on each of a top face and a back face of the piezoelectric body film of each of Examples and Comparative Example. Next, a test piece having a size of 7 mm×30 mm was cut from the piezoelectric body film, on which the aluminum electrodes were formed, as a sample for measuring the piezoelectric constant. Furthermore, a test piece having a size of 3 mm×60 mm was cut from the piezoelectric body film as a sample for measuring the extrapolated onset temperature.

Measurement of Piezoelectric Constant d31

Using the test piece of each of Examples and Comparative Example, the piezoelectric constant d31 was measured under the following conditions.

Measurement device: Rheolograph-Solid (available from Toyo Seiki Seisaku-sho, Ltd.)
Measurement temperature: 23° C.
Measurement frequency: 10 Hz
Applied tension: 1 N Measurement of Extrapolated Onset Temperature Using the test piece (3 mm×60 mm) of each of Examples and Comparative Example, the thermal shrinkage behavior was measured under the following conditions and, based on the measurement result, the extrapolated onset temperature was measured.

Measurement device: EXSTAR 6000 (available from Seiko Instruments, Inc.)
Starting temperature: 30° C.
End temperature: 150° C.
Temperature increasing rate: 2° C./min
Measurement interval: 1 second Measurement of Ratio of Decrease in Piezoelectric Constant d31

The following test treatment was performed for the test piece of each of Examples 1 to 10 and Comparative Example, and the piezoelectric constant d31 before the test and the piezoelectric constant d31 after the test were measured. Then, the ratio of decrease in the piezoelectric constant d31 after the test treatment relative to the piezoelectric constant d31 before the test treatment was calculated. The ratio of decrease was the ratio of the difference of the piezoelectric constants d31 before and after the test treatment to the piezoelectric constant d31 before the test treatment.

Test temperature: 100° C.
Test time: 24 hours
Test device: Thermostat HT320 (available from Kusumoto Chemicals, Ltd.) The types of the production method, the details of treatment conditions of secondary heating step, the details of treatment conditions of the second relaxation step, the extrapolated onset temperatures, the piezoelectric constants d31, and the ratios of decrease in the piezoelectric constant d31 of Examples 1 to 10 and Comparative Example were shown in Table 1. Furthermore, for Examples 1 to 10 and Comparative Example, the relationship between the extrapolated onset temperature and the ratio of decrease in piezoelectric constant d31 is shown in FIG. 1. Note that, in Table 1, the first production method was designated as "(1)", and the second production method is designated as "(2)". Furthermore, for each of Examples 1 to 8 that used the first production method, treatment conditions of the secondary heating step is shown as the heat treatment conditions, and for each of Examples 9 and 10 that used the second production method, treatment conditions of the second relaxation step is shown as the heat treatment conditions.

TABLE 1

| | Production method | Heat treatment condition (° C. × sec) | Extrapolated onset temperature (° C.) | Piezoelectric constant d31 (pC/N) | | d31 Ratio of decrease (%) |
|---|---|---|---|---|---|---|
| | | | | Prior to test | After test | |
| Example 1 | (1) | 90 × 60 | 92.3 | 28.4 | 23.9 | 15.8 |
| Example 2 | (1) | 100 × 60 | 95.5 | 28.6 | 25.0 | 12.6 |
| Example 3 | (1) | 110 × 60 | 100.4 | 28.1 | 23.1 | 17.8 |
| Example 4 | (1) | 120 × 60 | 106.8 | 26.9 | 22.8 | 15.2 |
| Example 5 | (1) | 125 × 40 | 112.9 | 28.7 | 26.1 | 9.1 |
| Example 6 | (1) | 125 × 60 | 114.8 | 26.8 | 25.9 | 3.4 |
| Example 7 | (1) | 130 × 60 | 118.9 | 25.1 | 24.1 | 4.0 |
| Example 8 | (1) | 130 × 20 | 112.3 | 27.2 | 25.0 | 8.1 |
| Example 9 | (2) | 135 × 20 | 98.8 | 27.6 | 26.8 | 2.9 |
| Example 10 | (2) | 135 × 20 | 108.8 | 27.3 | 25.3 | 7.3 |
| Comparative Example | | — | 84.8 | 27.9 | 21.6 | 22.6 |

As shown in Table 1, it was confirmed that the piezoelectric body film of Comparative Example had the piezoelectric constant d31 before the test of 27.9 pC/N, the piezoelectric constant d31 after the test of 21.6 pC/N, the extrapolated onset temperature of 84.8° C., and the ratio of decrease in the piezoelectric constant d31 of 22.6%. On the other hand, it was confirmed that the piezoelectric body film that had undergone the secondary heating step (Examples 1 to 8) had the piezoelectric constant d31 after the test of 22.8 pC/N or greater and 26.1 pC/N or less, the extrapolated onset temperature of 92.3° C. or higher, which was high, and the ratio of decrease of 17.8% or less, which was low. It was also confirmed that, for Examples 9 and 10, which were obtained by setting the heating temperature in the second relaxation step to 135° C. and performing no secondary heating step, the piezoelectric body film of Example 9 had the piezoelectric constant d31 after the test of 26.8 pC/N, which was higher than those of Examples 1 to 8, and the piezoelectric body film of Example 10 had the piezoelectric constant d31 after the test of 25.3 pC/N, which was higher than those of Examples 1 to 4, 7, and 8. It was also confirmed that the piezoelectric body film of each of Examples 9 and 10 had the extrapolated onset temperature of 98.8° C. or higher, which was high, and the ratio of decrease of 7.3% or lower, which was low. That is, it was confirmed that Examples 1 to 10 satisfied [Condition 1], [Condition 2], and [Condition 3].

Furthermore, as shown in Table 1 and FIG. 1, in Examples 1 to 10, it was confirmed that a higher extrapolated onset temperature tended to result in a lower ratio of decrease. Note that, it was also confirmed that a higher second temperature in the secondary heating step and a longer heating time in the secondary heating step tended to generally result in a lower extrapolated onset temperature and a lower ratio of decrease. In particular, it was confirmed that the condition in which the second temperature in the secondary heating step was 125° C. resulted in the extrapolated onset temperature of 110° C. or higher, which was significantly high, and the ratio of decrease of less than 10%, which was significantly low. Furthermore, it was confirmed that, in Examples 9 and 10, by treating at a high temperature, 135° C., in the second relaxation step, the ratio of decrease can be remarkably reduced.

According to the embodiments described above, the following effects can be achieved.

(1) During processing of a piezoelectric body film, reduction of the piezoelectric constant d31 due to the processing can be suppressed even when the piezoelectric body film is heated.

(2) Because the ratio of decrease in the piezoelectric constant d31 is ensured to be 20% or less, it also becomes possible to further ensure suppression of reduction in the piezoelectric constant d31 due to processing compared to a configuration in which a piezoelectric body film is specified only by [Condition 1] and [Condition 2].

(3) In a configuration in which the fluororesin constituting the piezoelectric body film is a homopolymer of vinylidene fluoride, it is easier to increase the piezoelectric constant d31 of the piezoelectric body film compared to a configuration where the fluororesin is a copolymer of vinylidene fluoride.

(4) For a method in which the first temperature and the second temperature are identical to each other, heating at the first temperature and heating at the second temperature can share the same heating equipment.

Note that the embodiments described above also can be changed and performed as described below.

In the first relaxation step, first temperatures that are different from each other can be employed, and a different heating method can be employed for each of the first temperatures. In the first relaxation step, first temperatures that are identical to each other can be employed, and a different heating method can be employed for each of the first temperatures.

In the secondary heating step, second temperatures that are different from each other can be employed, and a different heating method can be employed for each of the second temperatures. Furthermore, in the secondary heating step, second temperatures that are identical to each other can be employed, and a different heating method can be employed for each of the second temperatures.

In between the relaxation step and the secondary heating step, a form of storage of the crystalline polymer film at room temperature is not limited to a roll form to which the crystalline polymer film is wound, and for example, can be a form in which the crystalline polymer films are stacked and placed on a predetermined placement surface.

In the second relaxation step, heating temperatures that are higher than 115° C. and 150° C. or lower and that are different from each other can be employed, and a different heating method and/or a different heating time can be employed for each of the heating temperatures. Furthermore, in the second relaxation step, heating temperatures that are higher than 115° C. and 150° C. or lower and that are identical to each other can be employed, and a different heating method and a different heating time can be employed for each of the heating temperatures.

The invention claimed is:

1. A method of producing a piezoelectric body film, the method comprising:

forming a film, the forming including forming a crystalline polymer film having piezoelectricity by subjecting a sheet to stretching treatment and polarization treatment, the sheet being formed from a fluororesin containing a repeating unit derived from vinylidene fluoride as a main constituent unit;

performing relaxation including performing heat fixation and relaxation of residual strain of the crystalline polymer film by subjecting the crystalline polymer film to heating at a first temperature that is not lower than 90° C. and not higher than 115° C. for not less than 5 seconds and not more than 130 seconds; and performing a secondary heating including subjecting the crystalline polymer film after the performing relaxation to reheating at a temperature that is not lower than the first temperature and not higher than 140° C. for not less than 15 seconds and not more than 120 seconds, and producing the piezoelectric body film.

2. The method of producing a piezoelectric body film according to claim 1, wherein, in the performing the secondary heating, heating of the crystalline polymer film is performed at the first temperature.

3. A method of producing a piezoelectric body film from a crystalline polymer sheet, the method comprising:

forming a film, the forming including forming a crystalline polymer film having piezoelectricity by subjecting a sheet to stretching treatment and polarization treatment, the sheet being formed from a fluororesin containing a repeating unit derived from vinylidene fluoride as a main constituent unit; and performing relaxation including performing heat fixation and relaxation of residual strain of the crystalline polymer film by subjecting the crystalline polymer film to heating at a temperature higher than 115° C. and not higher than 150° C. for not less than 10 seconds and not more than 140 seconds.

\* \* \* \* \*